(12) United States Patent
Ammerman et al.

(10) Patent No.: US 7,340,357 B2
(45) Date of Patent: Mar. 4, 2008

(54) ARBITRARY WAVEFORM GENERATOR WITH CONFIGURABLE DIGITAL SIGNAL PROCESSING UNIT

(75) Inventors: Johnathan R. W. Ammerman, Austin, TX (US); Cary Paul Butler, Austin, TX (US)

(73) Assignee: National Instruments Corporation, Austin, TX (US)

( * ) Notice: Subject to any disclaimer, the term of this patent is extended or adjusted under 35 U.S.C. 154(b) by 0 days.

(21) Appl. No.: 11/140,571

(22) Filed: May 27, 2005

(65) Prior Publication Data

US 2006/0271317 A1    Nov. 30, 2006

(51) Int. Cl.
*G01R 13/00* (2006.01)
(52) U.S. Cl. ...................................... 702/66
(58) Field of Classification Search ................. 702/66, 702/112, 124; 324/76.12, 76.14
See application file for complete search history.

(56) References Cited

U.S. PATENT DOCUMENTS

| | | | |
|---|---|---|---|
| 4,222,108 A | 9/1980 | Braaten | 364/608 |
| 4,667,302 A | 5/1987 | Mackey et al. | 364/718 |
| 4,956,798 A | 9/1990 | Dinteman | 364/718 |
| 5,258,937 A | 11/1993 | Blackmon | 364/718 |
| 5,463,334 A | 10/1995 | Griffin et al. | 327/106 |
| 6,046,570 A | 4/2000 | Gabbai et al. | 320/101 |
| 6,085,309 A * | 7/2000 | Okamura | 712/35 |
| 6,356,224 B1 | 3/2002 | Wohlfarth | 514/120 |
| 6,559,791 B1 | 5/2003 | Davidson | 342/169 |
| 6,591,205 B1 | 7/2003 | Colby | 702/66 |
| 2002/0090036 A1 | 7/2002 | Matsuska | 375/296 |
| 2004/0070410 A1 | 4/2004 | Nakagawa | 324/709 |

OTHER PUBLICATIONS

Analog Devices, CMOS 200 MSPS 14-Bit Quadrature Digital Upconverter AD9857, Printed 2004, p. 1-40.*
http://en.wikipedia.org/wiki/Intel_8051, p. 1-3.*
http://en.wikibooks.org/wiki/Embedded-Systems/ 8051_microcontroller, p. 1-4.*

(Continued)

*Primary Examiner*—John Barlow
*Assistant Examiner*—Tung S. Lau
(74) *Attorney, Agent, or Firm*—Meyertons Hood Kivlin Kowert & Goetzel, P.C.; Jeffrey C. Hood; Mario J. Lewin

(57) ABSTRACT

An arbitrary waveform generator including a digital signal procession unit and a memory. The digital signal processing unit may be configurable to interconnect a plurality of processing components in different configurations to process data received from the memory and perform one of a plurality of different functions to compute or enhance waveforms without having to store complex waveform data in the memory. In a first configuration, the digital signal processing unit may perform digital up-conversion functions on received waveform data to generate enhanced waveform data, and in a second configuration may perform data interpolation functions to generate enhanced waveform data. In a third configuration, the digital signal processing unit may receive data comprising attributes of a waveform from the memory and perform hardware-controlled arbitrary waveform generation functions. In a fourth configuration, the digital signal processing unit may receive information from software and perform software-controlled arbitrary waveform generation functions.

27 Claims, 4 Drawing Sheets

OTHER PUBLICATIONS

"Wideband Quad Digital Down-Converter/Up-Converter," http://focus.ti.com/lit/ds/symlink/gc5016.pdf, Jan. 2003, (89 Pages).

AD6623-104 MSPS, Four-Channel Digital Transmit Signal Processor (TSP), http://www.analog.com/en/prod/0%2C2877%2CAD6623%2C00.html, Sep. 2002, (6 Pages).

AD9857-CMOS 200 MSPS 14-Bit Quadrature Digital Upconverter, http://www.analog.com/en/prod/0%2C2877%2CAD9857%2C00.html, May 2004, (3 Pages).

"Model 7340 Dual Digital Up/Downconverter 3U cPCI with FPGA"; Retrieved from the Internet: http://www.pentek.com/products/Detail.CFM?Model=7340; 3 pages, Mar. 16, 2007.

"12-Channel Digital Transmitter Module"; Retrieved from the Internet: http://www.mc.com/literature/literature_files/Echotek-Series-ECTR-GC314-PMC-ds.pdf; 2005; 2 pages, Mar. 16, 2007.

"ISL5217—Quad Programmable Up Converter"; Retrieved from the Internet: http://www.intersil.com/data/fn/fn6004.pdf; Jul. 8, 2005; 43 Pages.

* cited by examiner

ARBITRARY WAVEFORM GENERATOR WITH CONFIGURABLE DIGITAL SIGNAL PROCESSING UNIT

BACKGROUND OF THE INVENTION

1. Field of the Invention

This invention relates to instrumentations systems and, more particularly, to arbitrary waveform generator design.

2. Description of the Related Art

Signal generation is used in a wide variety of applications, including, for example, industrial testing and verification, product design, and control, among others. In one application of signal generation, a signal is generated according to waveform data, and provided as input or stimulus to a unit under test (UUT). Resulting output from the UUT may then be analyzed to characterize the UUT, e.g., for quality control, design feedback, etc. Generally, waveform generators are used to generate such signals.

Waveform generators may be used to produce one or more waveforms having defined characteristics. A waveform is a graphical representation of a signal, for example, an analog data signal or a digital data signal. The graphical representation may be a plot of amplitude (e.g., voltage) versus time. Therefore, a waveform representing an analog signal may comprise continuous and varying amplitude plots with respect to time (e.g., a sinusoidal wave), and a waveform representing a digital signal may comprise one or more pulses or discrete amplitude plots with respect to time (e.g., a binary pattern).

Waveform generators may be stand-alone systems or computer-based systems. In addition, waveform generators, also called signal sources, may be classified into two general types of waveform generators: arbitrary waveform generators and digital waveform generators. Arbitrary waveform generators are primarily used in analog and mixed-signal applications. Digital waveform generators, also called logic signal sources, include two classes of instruments: pattern generators and pulse generators. Logic signal sources are primarily used in digital system applications, for example, to provide stimulus signals, such as digital data patterns.

Waveform generators may generate waveforms by several methods. For example, waveform generators may create a waveform in response to a user input based on a plurality of waveform definitions. Additionally, waveform generators may create waveforms by receiving an existing signal and reproducing the signal. Furthermore, waveform generators may modify an existing signal. After creating, reproducing, and/or modifying a signal, waveform generators may output the one or more analog or digital signals.

SUMMARY OF THE INVENTION

Various embodiments of an arbitrary waveform generator including a digital signal procession unit and a memory are disclosed. The digital signal processing unit may include a plurality of processing components. The digital signal processing unit may be configurable to interconnect at least a subset of the plurality of processing components in different configurations to process data received from the memory and perform one of a plurality of different functions to compute or enhance waveforms. In one embodiment, the digital signal processing unit may be configurable by a user via software to perform the different waveform generation functions.

In a first configuration, the digital signal processing unit may receive waveform data from the memory and perform digital up-conversion functions on the received waveform data to generate enhanced waveform data. In a second configuration, the digital signal processing unit may receive waveform data from the memory and perform data interpolation functions on the received waveform data to generate enhanced waveform data. In a third configuration, the digital signal processing unit may receive data comprising attributes of a waveform from the memory and perform hardware-controlled arbitrary waveform generation functions to generate waveform data. In a fourth configuration, the digital signal processing unit may receive customized waveform data from software and perform software-controlled arbitrary waveform generation functions.

Typically, waveforms generated by arbitrary waveform generators need to meet strict frequency or time domain specifications. This can often translate into very complex waveforms that require time-consuming software computation, large amounts of on-board memory, and large download times. Computing these complex waveforms in hardware may alleviate many of the disadvantages of typical arbitrary waveform generators. Performing computations in hardware is usually much faster than software computations. Also, by performing hardware computations, much smaller (less complex) waveforms may need to be saved in the memory since the hardware would compute the complex waveforms during the waveform generation process. Since less memory may be required to store waveform data, memory download times may be significantly reduced.

Figure 1:
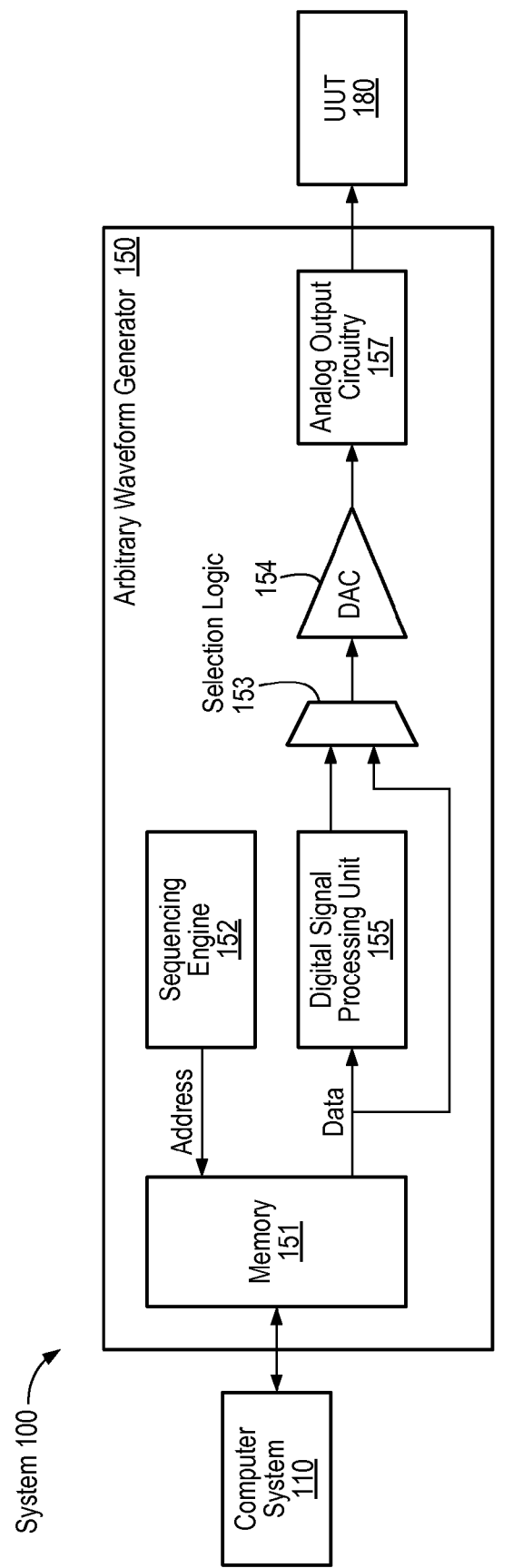
FIG. 1 is a block diagram of one embodiment of a waveform generation system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION

Waveform Generation System

Turning now to FIG. 1, a block diagram of one embodiment of a waveform generation system 100 is shown. In the illustrated embodiment, the system 100 includes a computer system 110, an arbitrary waveform generator 150, and a unit under test (UUT) 180. The computer system 110 is connected to the arbitrary waveform generator 150, which is further connected to the UUT 180. The computer system 110 may be a personal computer (PC) system. However, it is noted that in other embodiments the computer system 110 may be any of various types of computing or processing systems, including mainframe computer systems, workstations, and portable computers, among others. It is also noted that the components of the system 100 may be interconnected in various ways.

The arbitrary waveform generator 150 may be a board or card which may be receivable in the computer system 110. It is noted however that in some embodiments the arbitrary waveform generator 150 may be another type of device, for example, a stand-alone system, or an integrated circuit (IC), among others. The arbitrary waveform generator 150 may be connected to the UUT 180 to generate a signal based on waveform data to stimulate the UUT 180. In some embodiments, an output signal from the UUT 180 is analyzed by the computer system 110 to characterize the UUT.

In the illustrated embodiment of FIG. 1, the arbitrary waveform generator 150 includes a memory 151, a sequencing engine 152, a digital signal processing unit 155, selection logic 153, a digital-to-analog converter (DAC) 154, and an analog output circuitry 157. Specifically, the memory 151 is coupled to the sequencing engine 152, the digital signal processing unit 155, and the selection logic 153. The digital signal processing unit 155 is connected to the selection logic 153, which is coupled to the DAC 154. The DAC 154 is connected to the analog output circuitry 157.

The memory 151 may receive data from the computer system 110 and may store the data for waveform generation. The data may be waveform data or data comprising attributes of a waveform. It is noted however that in some embodiments the memory 151 of the arbitrary waveform generator 150 may receive data from other devices and/or the data may be in other forms. The sequencing engine 152 may access one or more address locations in the memory 151 to download data for waveform generation functions. The downloaded data may be sent to the digital signal processing unit 155 to perform hardware computations on the data and generate enhanced waveform data. The generated waveform data may then be sent to the DAC 154 to convert the digital data into analog form. The analog output circuitry 157 may modify the analog signals and may output the corresponding waveform, e.g., to stimulate the UUT 180.

It should be noted that the components described with reference to FIG. 1 are meant to be exemplary only, and are not intended to limit the invention to any specific set of components or configurations. For example, in various embodiments, one or more of the components described may be omitted, combined, modified, or additional components included, as desired. For instance, in some embodiments, the arbitrary waveform generator 150 may include additional components or some of the illustrated components may be replaced with alternative components. Also, in other embodiments, the system 100 may include a stand-alone waveform generator having the digital signal processing unit 155, rather than a computer-based waveform generator.

Arbitrary Waveform Generator with Configurable Digital Signal Processing Unit

Figure 2:
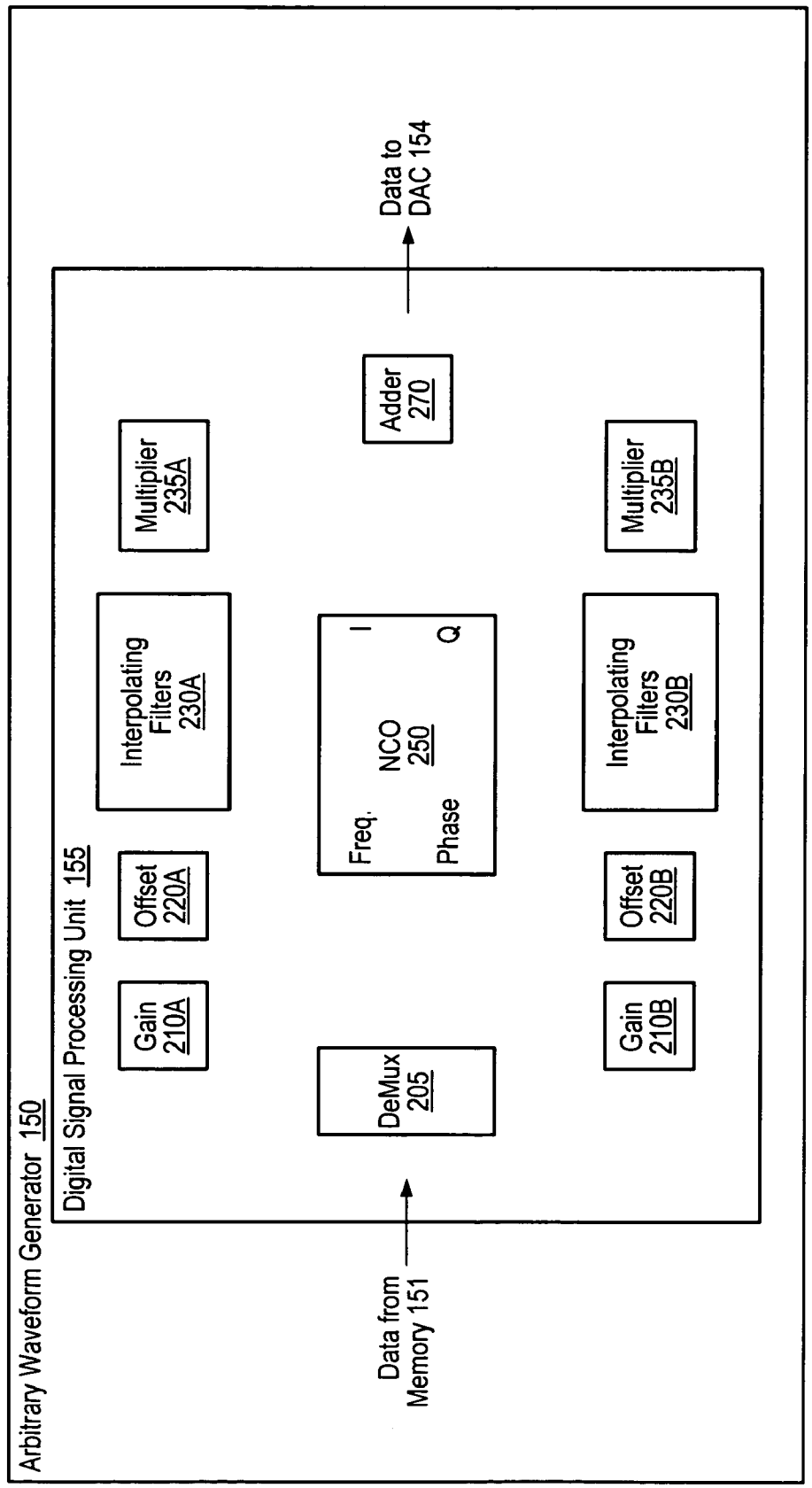
FIG. 2 is a block diagram of one embodiment of the digital signal processing unit comprised in the arbitrary waveform generator of FIG. 1.

FIG. 2 is a block diagram of one embodiment of the digital signal processing unit 155 comprised in the arbitrary waveform generator 150. The digital signal processing unit 155 may be implemented in hardware and/or software and may be comprised in an integrated circuit (IC), e.g., a digital IC. In one embodiment, the digital signal processing circuit 155 may be implemented in a field programmable gate array (FPGA). It is noted however that in other embodiments the digital signal processing circuit 155 may be implemented in any type of circuit. The digital signal processing unit 155 may receive data from memory (e.g., memory 151 of FIG. 1) to perform hardware computations on the data and generate enhanced waveform data for a DAC (e.g., DAC 154 of FIG. 1).

In the illustrated embodiment, the digital signal processing unit 155 includes a plurality of processing components, including gain circuits 210A and 210B (gain circuitry 210), offset circuits 220A and 220B (offset circuitry), interpolating filters 230A and 230B (interpolating filters 230), multipliers 235A and 235B (multipliers 235), an adder 270, a demultiplexer 205, and numerically-controlled oscillator (NCO) 250. In one embodiment, the demultiplexer 205 may be logic that demuxes or divides a single data stream received from the memory 151 into multiple outputs. Each of the gain circuits 210 may be digital multipliers that controls the gain of a data path. Each of the offset circuits 220 may be a digital adder that controls the offset of the data path. The interpolation filters 230 may be digital filters that interpolate received data from a slow sample rate up to a higher sample rate. The NCO 250 may be a device that can generate an arbitrary waveform at a programmable frequency with two independent programmable phase outputs. The multipliers 235 may be digital multipliers used to mix the in-phase (I) and quadrature-phase (Q) data paths with the NCO 250 during an up-conversion function, as will be further described below. The adder 270 may be a digital adder used to combine the I and Q data paths during an up-conversion function.

Typically, waveforms generated by arbitrary waveform generators need to meet strict frequency or time domain specifications. This can often translate into very complex waveforms that require time-consuming software computation, large amounts of on-board memory, and large download times. Computing these complex waveforms in hardware may alleviate many of the disadvantages of typical arbitrary waveform generators. Performing computations in hardware is usually much faster than software computations. Also, by performing hardware computations, much smaller (less complex) waveforms may need to be saved in the memory 151 since the hardware would be computing the complex waveforms during the waveform generation process. Since less memory 151 may be required to store waveform data, memory download times may be significantly reduced. In one embodiment, the digital signal processing unit 155 of the arbitrary waveform generator 150 may be used to perform the necessary computations in hardware.

The digital signal processing unit 155 may compute or enhance waveforms for many applications. The digital signal processing 155 unit may interconnect at least a subset of the plurality of processing components in different configurations to process the data received from the memory 151 and perform one of a plurality of different functions to compute or enhance waveforms. In one embodiment, the digital signal processing unit 155 is configurable by a user via software in the computer system 110 to perform the different functions. It is noted however that in some embodiments the digital signal processing unit 155 may be configurable by other methods, e.g., by software from a device other than computer system 110. Also, in one embodiment, each of the plurality of processing components of the digital signal processing unit 155 may be programmable (and re-programmable) by software to process the data received from the memory 151 in various ways, e.g., components may be programmable with different attributes of a waveform.

In a first configuration, the digital signal processing unit 155 may receive waveform data from the memory 151 and perform digital up-conversion functions on the received waveform data to generate enhanced waveform data. In a second configuration, the digital signal processing unit 155 may receive waveform data from the memory 151 and perform data interpolation functions on the received waveform data to generate enhanced waveform data. In a third configuration, the digital signal processing unit 155 may receive data comprising attributes of a waveform from the memory 151 and perform hardware-controlled arbitrary waveform generation functions to generate waveform data. In a fourth configuration, the digital signal processing unit 155 may receive information from software (e.g., of computer system 110) and perform software-controlled arbitrary waveform generation functions. Embodiments of the first through the fourth configurations of the digital signal processing unit 155 will be further described below with reference to FIGS. 3-6.

It should be noted that the components described with reference to FIG. 2 are meant to be exemplary only, and are not intended to limit the invention to any specific set of components or configurations. For example, in various embodiments, one or more of the components described may be omitted, combined, modified, or additional components included, as desired. For instance, in some embodiments, the digital signal processing unit 155 of the arbitrary waveform generator 150 may be configured to any number of configurations to perform different functions, e.g., two configurations or six configurations. Also, in other embodiments one or more of the plurality of processing components may have a different design or configuration.

Figure 3:
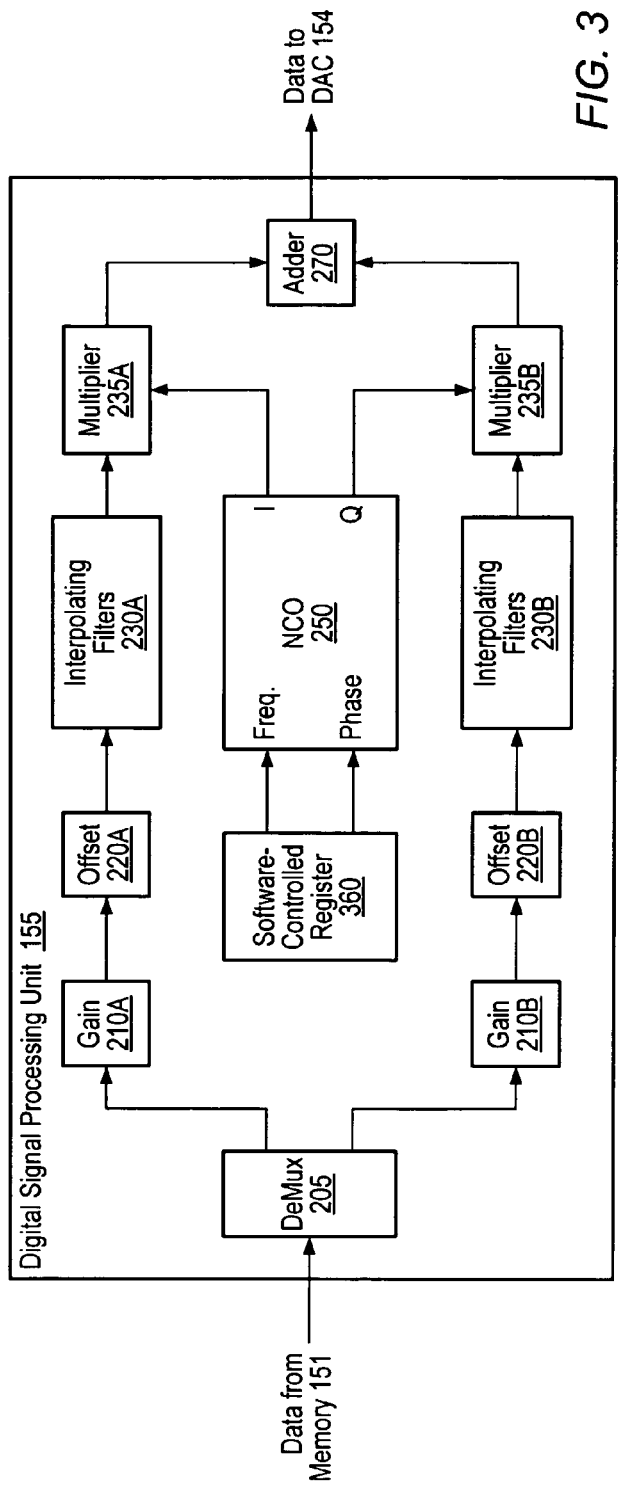
FIG. 3 is a block diagram of one embodiment of the digital signal processing unit in a first configuration for performing up-conversion functions.

FIG. 3 is a block diagram of one embodiment of the digital signal processing unit 155 in a first configuration for performing up-conversion functions. The first configuration may include a first data path and a second data path and may include the plurality of processing components interconnected in a particular way to perform up-conversion functions. The first data path may include a first programmable gain circuit 210A coupled to a first programmable offset circuit 220A, which is further coupled to first programmable interpolating filters 230A. The second data path may include a second programmable gain circuit 210B coupled to a second programmable offset circuit 220B, which is further coupled to second programmable interpolating filters 230B. The output terminal of the interpolating filters 230A may be coupled to a first input terminal of the multiplier 235A, and the output terminal of the interpolating filters 230B may be coupled to a first input terminal of the multiplier 235B. A first output terminal of the NCO 250 may connected to a second input terminal of the multiplier 235A, and a second output terminal of the NCO 250 may connected to a second input terminal of the multiplier 235B. Also, each of the outputs of the multiplier 235A and the multiplier 235B may be connected to one of the inputs of the adder 270. The output terminal of the adder 270 may be connected to the output terminal of the digital signal processing unit 155 to provide output waveform data to the DAC 154.

The digital signal processing unit 155 may also include one or more software-controlled registers, which are controlled by software in the computer system 110 of FIG. 1. It is noted however that in some embodiments the software-controlled registers may be controlled by software from other devices other than the computer system 110. In the first configuration, a software-controlled register 360 may be coupled to the programmable NCO 250 to control the frequency and phase of the waveforms generated by the NCO 250. It is also noted that in some embodiments additional software-controlled registers may be coupled to the gain circuitry 210, the offset circuitry 220, and/or the interpolation filters 230 to control the gain, offset, and interpolation functions.

In the first configuration for performing digital up-conversion functions, the first data path may receive base-band in-phase (I) data and the second data path may receive base-band quadrature-phase (Q) data from the memory 151. The digital signal processing unit 155 may first perform gain and offset functions via the programmable gain circuitry 210 and the programmable offset circuitry 220, respectively. The digital signal processing unit 155 may then interpolate the base-band in-phase and quadrature-phase (IQ) data from a particular sample rate up to a higher sample rate via the programmable interpolation filters 230, and then translate the base-band IQ data to a programmable carrier frequency provided by the NCO 250 to generate enhanced waveform data. More specifically, each of the outputs from the first and second data paths are mixed with the corresponding NCO output via the multipliers 235, and then combined by the adder 270 to generate the enhanced waveform data at an intermediate frequency (IF).

Figure 4:
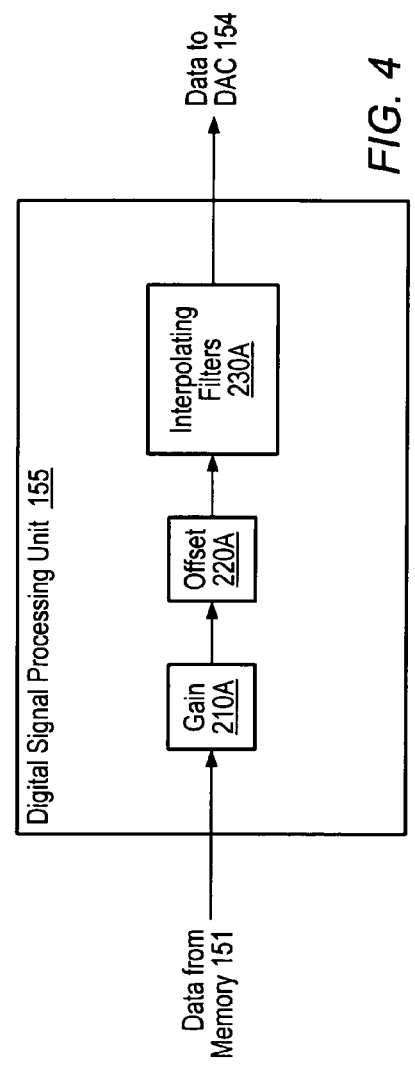
FIG. 4 is a block diagram of one embodiment of the digital signal processing unit in a second configuration for performing data interpolation functions.

FIG. 4 is a block diagram of one embodiment of the digital signal processing unit 155 in a second configuration for performing data interpolation functions. The first configuration may include a data path for receiving waveform data from the memory 151. The data path may include the programmable gain circuit 210A connected to the programmable offset circuit 220A, which may be further connected to programmable interpolating filters 230A. The digital signal processing unit 155 may translate waveform data at a particular sample rate up to a higher sample rate to generate enhanced waveform data. Typically, DACs (e.g., DAC 154) have better performance when sampling at higher rates. Sampling at a higher sample rate may also ease analog filter requirements. By performing the interpolation functions in the digital signal processing unit 155, systems (e.g., system 100 of FIG. 1) can store smaller waveforms in memory (e.g., memory 151) and still get the benefits of sampling at higher rates at the DAC.

Figure 5:
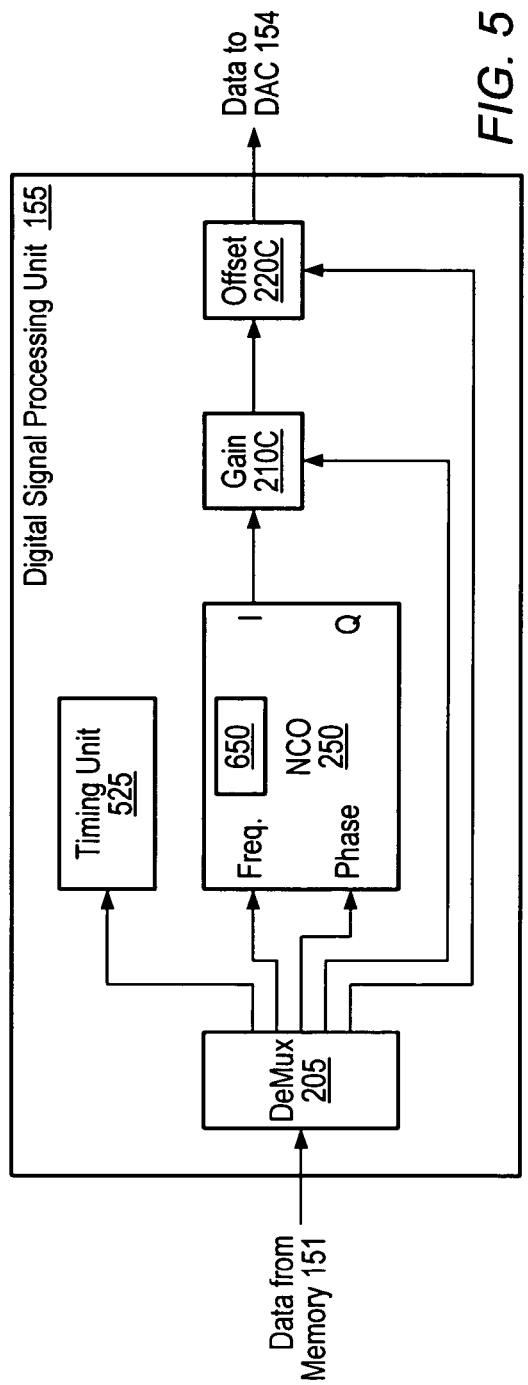
FIG. 5 is a block diagram of one embodiment of the digital signal processing unit in a third configuration for performing hardware-controlled arbitrary waveform generation functions by using a numerically-controlled oscillator (NCO)

FIG. 5 is a block diagram of one embodiment of the digital signal processing unit 155 in a third configuration for performing hardware-controlled arbitrary waveform generation functions by using the NCO 250. The third configuration includes a plurality of data paths operable to receive data comprising different attributes of a waveform from the memory 151. The memory 151 may store lists of attributes, e.g., frequencies, phases, amplitudes, offsets, and duration, among others, which may be sent to the NCO 250 to generate the corresponding waveforms, e.g., sine waves. It is noted however that in some embodiments the NCO 250 may generate other types of signals. Therefore, instead of using a substantial amount of the memory 151 for storing complex waveform data, the memory 151 may store these lists of attributes.

In the third configuration, a first data path of the digital signal processing unit 155 may receive frequency data to program the NCO 250 and a second data path may receive phase data to program the NCO 250. A third data path may receive gain data to program the gain circuitry 210 and a fourth data path may receive offset data to program the offset circuitry 220. In response to receiving the frequency and phase data, the NCO 250 may generate a waveform having the corresponding attributes, which may then be sent to the gain circuitry 210 and the offset circuitry 220. As a result, the digital signal processing unit 155 may generate complex waveform data having the programmed attributes, which may be further processed by the DAC 154.

The frequency, phase, gain, and offset lists that are stored in the memory 151 control the NCO 250, the gain circuitry 210, and the offset circuitry 220 to generate the desired waveform. As described above, the lists stored in the memory 151 may also include duration data. The duration data may control how long the components of the digital signal processing unit 155 apply a certain data set to their processing. For example, duration data may control how long the components are to apply a certain frequency, phase, gain, and offset for generating waveform data. The duration may be any amount of time, for example, 1.1 µs or 3.2 µs. In one embodiment, the duration data may program the digital signal processing unit 155 to apply specific attributes corresponding to the duration data for a particular period of time. In one embodiment, the duration data may program a timing unit 525 of the digital signal processing unit 155 to control the timing of the components. This hardware-controlled timing is very deterministic, unlike software-controlled timing. The hardware may control the instances of time when the frequency, phase, gain, and/or offset are changed, and therefore may control the instance of time when a particular waveform having certain attributes is generated.

In the third configuration, the NCO 250 may include a memory 650, which may be a bank of memory that is independent from the main arbitrary waveform memory 151. The NCO memory 650 may receive and store waveform data from software. The stored waveform data may be used by the NCO 250 to generate any type of waveform, which is specified by software. In one embodiment, the NCO memory 650 may be loaded with a custom waveform, and then the NCO 250 may perform arbitrary waveform generator functions based on the waveform data received from software.

The use of the NCO 250 for arbitrary waveform generation may allow phase coherent frequency changes as well as excellent frequency resolution, and at the same time may save memory by storing attribute lists (and computing complex waveform data) instead of storing complex waveform data in the memory 151. When compared to hardware, using software typically takes a substantial amount of memory to create complex waveforms having excellent resolution and frequencies having many degrees of precision. The NCO 250 may compute the required frequencies on the fly and save computation time and memory. Furthermore, the duration data provided for hardware-controlled timing may also save memory compared to software-controlled timing. In software-controlled timing, data many need to be sent from memory continuously, which may require a considerable amount of memory. In hardware-controlled timing, the duration data may program the digital signal processing unit 155 for a particular time period and memory may not need to pull the next data set until the time period expires.

Figure 6:
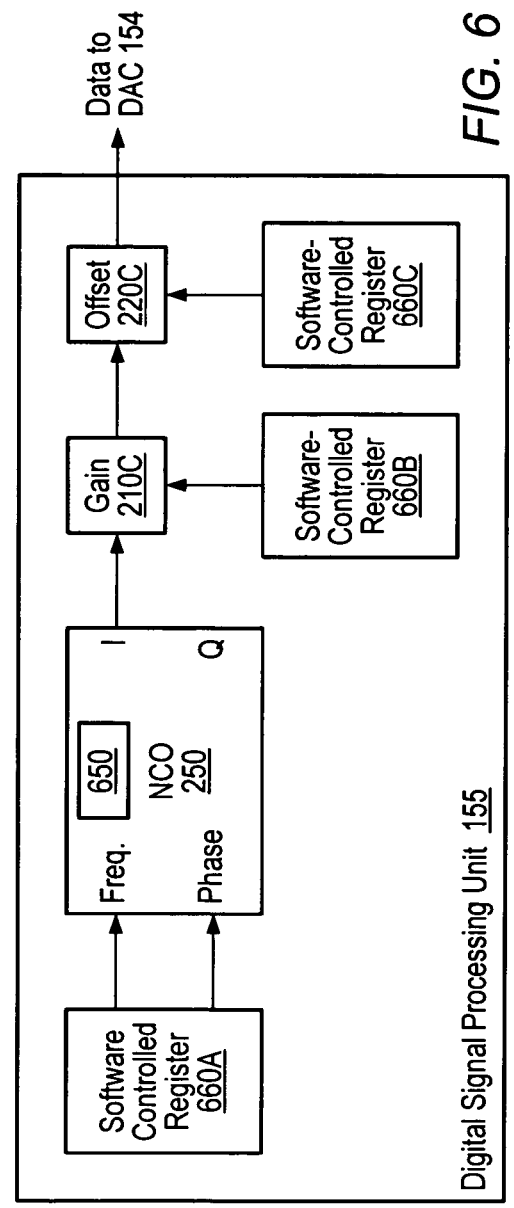
FIG. 6 is a block diagram of one embodiment of the digital signal processing unit in a fourth configuration for performing software-controlled arbitrary waveform generation functions by using an NCO.

FIG. 6 is a block diagram of one embodiment of the digital signal processing unit 155 in a fourth configuration for performing software-controlled arbitrary waveform generation functions by using the NCO 250. The fourth configuration includes a subset of the processing components of the digital signal processing unit 155 interconnected in a particular way and controlled by software (e.g., software from computer system 110) to perform waveform generation functions. In the fourth configuration, a software-controlled register 660A may be connected to the programmable NCO 250, which may be further connected to a programmable gain circuit 210C and a programmable offset circuit 220C. A software-controlled register 660B may be connected to the gain circuit 210C and a software-controlled register 660C may be connected to the offset circuit 220C.

Similar to the third configuration described above, in the fourth configuration the NCO memory 650 may receive and store waveform data from software, which may be used by the NCO 250 to generate any type of waveform. In one embodiment, the NCO memory 650 may be loaded with a custom waveform, and then the NCO 250 may perform arbitrary waveform generator functions based on the waveform data received from software. It is noted however that in other embodiments, in the fourth configuration, the digital signal processing unit 155 (including the NCO 250) may receive data comprising attributes of a waveform from software and perform software-controlled arbitrary waveform generation functions depending on the received attributes. As described above, the use of the NCO 250 for arbitrary waveform generation allows phase coherent frequency changes as well as excellent frequency resolution without the use of large amount of memory 151.

It should be noted that the components and configurations described with reference to FIGS. 3-6 are meant to be exemplary only, and are not intended to limit the invention to any specific set of components or configurations. For example, in various embodiments, one or more of the components described may be omitted, combined, modified, or additional components included, as desired. For instance, in some embodiments, the interconnections of the different components in each of the various configurations of the digital signal processing unit 155 may vary. Also, in other embodiments, the digital signal processing unit 155 may also be configurable to implement down-conversion functions.

In one embodiment, as shown in FIG. 1, the digital signal processing unit 155 of the arbitrary waveform generator 150 is software selectable. The software (e.g., the software from computer system 110) may control the selection logic 153 to select or bypass the digital signal processing unit 155. Since the digital signal processing unit 155 may be bypassed, time domain applications may still be solved by using the typical arbitrary waveform generation techniques. In addition, there may be digital up-conversion cases that require specifications that are outside of the hardware implementation's ability. In these cases, the digital signal processing unit 155 may be bypassed and these digital up-conversion functions may be implemented in software. It is noted that in some embodiments the digital signal processing unit 155 may be bypassed at any time in one or more of the configurations described above.

Besides the digital signal processing unit 155 being highly configurable (via software control) into at least the various configurations described above, the components within the digital signal processing unit 155 are highly programmable and re-programmable. Even during generation, the processing components may be programmed and re-programmed to generate the desired waveform data. For each of the configurations described above, the gain, offset, frequency, phase, the rate at which data is received at the digital signal processing unit 155, and the rate at which data leaves the digital signal processing unit 155 may all be programmable (e.g., via software-controlled registers), even during generation. It is noted however that in some embodiments other attributes, timing data, and additional characteristics may also be programmable. It is also noted that the digital signal processing unit 155 may be re-configurable as many times as necessary. For example, the digital signal processing unit 155 may be re-configurable from one of the configurations to another one of the configurations.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An arbitrary waveform generator comprising:
   a memory operable to store data for waveform generation; and
   a digital signal processing unit configurable to perform one of a plurality of functions on data obtained from the memory;
   wherein, in a first configuration, the digital signal processing unit is operable to obtain waveform data from the memory via a plurality of data paths and perform digital up-conversion functions on the obtained waveform data;
   wherein, in the first configuration, the digital signal processing unit is operable to obtain base-band in-phase (I) data via a first data path and base-band quadrature-phase (Q) data via a second data path, wherein the first data path includes a first programmable gain circuit coupled to a first programmable offset circuit which is further coupled to first programmable interpolating filters, wherein the second data path includes a second programmable gain circuit coupled to a second programmable offset circuit which is further coupled to second programmable interpolating filters, wherein each of the first and second programmable gain circuits is programmable to control the gain independent of the offset, and each of the first and second programmable offset circuits is programmable to control the offset independent of the gain;
   wherein, in a second configuration, the digital signal processing unit is operable to obtain waveform data from the memory and perform data interpolation functions on the obtained waveform data; and
   wherein, in a third configuration, the digital signal processing unit is operable to obtain data comprising attributes of a waveform from the memory and perform hardware-controlled arbitrary waveform generation functions to generate waveform data.

2. The arbitrary waveform generator of claim 1, wherein the digital signal processing unit includes additional processing components including a programmable numerically-controlled oscillator (NCO), wherein the digital signal processing unit is operable to interconnect at least a subset of the plurality of processing components in different configurations to perform one of the plurality of functions using the data obtained from the memory.

3. The arbitrary waveform generator of claim 2, wherein, in the first configuration for performing digital up-conversion functions, the digital signal processing unit is operable to interpolate the base-band in-phase and quadrature-phase (IQ) data from a particular sample rate up to a higher sample rate via the programmable interpolation filters and then translate the base-band IQ data to a programmable carrier frequency provided by the programmable NCO.

4. The arbitrary waveform generator of claim 2, wherein, in the second configuration, a data path of the digital signal processing unit receives the waveform data, wherein the data path includes a programmable gain circuit coupled to a programmable offset circuit which is further coupled to programmable interpolating filters, wherein the digital signal processing unit is operable to translate the received waveform data at a particular sample rate up to a higher sample rate.

5. The arbitrary waveform generator of claim 3, wherein, in the first configuration, prior to the interpolation function, the digital signal processing unit is also operable to perform gain and offset functions via the programmable gain and offset circuitry.

6. An arbitrary waveform generator comprising:
   a memory operable to store data for waveform generation; and
   a digital signal processing unit configurable to perform one of a plurality of functions on data obtained from the memory;
   wherein, in a first configuration, the digital signal processing unit is operable to obtain waveform data from the memory and perform digital up-conversion functions on the obtained waveform data;
   wherein, in a second configuration, the digital signal processing unit is operable to obtain waveform data from the memory and perform data interpolation functions on the obtained waveform data; and
   wherein, in the third configuration, the digital signal processing unit is operable to obtain data comprising attributes of a waveform from the memory via a plurality of data paths and perform hardware-controlled arbitrary waveform generation functions to generate waveform data, wherein the digital signal processing unit is operable to obtain frequency data via a first data path to program a numerically-controlled oscillator (NCO), phase data via a second data path to program the NCO, gain data via a third data path to program gain circuitry, and offset data via a fourth data path to program offset circuitry, wherein based on the programmed frequency, phase, gain, and offset the digital signal processing unit is operable to generate waveform data having the corresponding attributes, wherein the gain circuitry of the digital signal processing unit is programmable to control the gain independent of the offset, and the offset circuitry of the digital signal processing unit is programmable to control the offset independent of the gain.

7. The arbitrary waveform generator of claim 6, wherein the data comprising attributes of a waveform obtained from the memory also includes duration data, wherein, in the third configuration, the digital signal processing unit is configured to be programmed with the duration data to perform hardware-controlled timing during generation of waveform data, wherein, after being programmed, the digital signal processing unit is operable to apply specific attributes for a particular period of time specified by the duration data to generate waveform data having the specific attributes.

8. The arbitrary waveform generator of claim 6, wherein the NCO includes an NCO memory that is operable to receive and store customized waveform data from software, wherein the NCO is operable to perform arbitrary waveform generation functions based on the customized waveform data stored in the NCO memory.

9. The arbitrary waveform generator of claim 6, wherein in a fourth configuration the digital signal processing unit is operable to perform software-controlled arbitrary waveform generation functions.

10. The arbitrary waveform generator of claim 6, further comprising a sequencing engine operable to access one or more address locations in the memory to provide the corresponding data to the digital signal processing unit.

11. The arbitrary waveform generator of claim 6, further comprising software-controlled selection logic operable to bypass the digital signal processing unit during particular waveform generation operations.

12. The arbitrary waveform generator of claim 6, further comprising a digital-to-analog converter (DAC), wherein the DAC is configured to convert the waveform data generated by the digital signal processing unit to analog form, wherein the arbitrary waveform generator is configured to couple to a computer system which is configured to provide data for waveform generation to the memory of the arbitrary waveform generator, wherein the arbitrary waveform generator is further configured to couple to a unit under test (UUT) to provide waveforms to stimulate the UUT.

13. The arbitrary waveform generator of claim 6, wherein the memory is operable to store data comprising lists of attributes of waveforms, wherein each of the lists of attributes of waveforms stored in the memory includes frequency data, phase data, gain data, and offset data, wherein in the third configuration the digital signal processing unit is operable to obtain the data comprising lists of attributes of waveforms from the memory and program the plurality of processing components using the obtained data, wherein based on the programmed frequency, phase, gain, and offset the digital signal processing unit is operable to generate waveform data having the corresponding attributes.

14. The arbitrary waveform generator of claim 7, wherein, in the third configuration, the duration data obtained from the memory programs the digital signal processing unit to apply a first frequency, phase, gain, and offset for a first period of time to generate waveform data, wherein, after the first period of time, the duration data programs the digital signal processing unit to apply a second frequency, phase, gain, and offset for a second period of time to generate additional waveform data.

15. The arbitrary waveform generator of claim 9, wherein in the fourth configuration a programmable NCO is coupled to a programmable gain circuit, which is further coupled to a programmable offset circuit, wherein the NCO includes an NCO memory that is operable to receive and store customized waveform data from software, wherein the NCO is operable to perform arbitrary waveform generation functions based on the customized waveform data stored in the NCO memory.

16. The arbitrary waveform generator of claim 13, further comprising a timing unit, wherein the lists of attributes of waveforms stored in the memory further include duration data, wherein in the third configuration the digital signal processing unit is operable to obtain the duration data from the memory and program the timing unit to implement hardware-controlled timing during generation of waveform data.

17. An arbitrary waveform generator comprising:
a memory operable to store data for waveform generation; and
a digital signal processing unit configurable to perform one of a plurality of functions on data obtained from the memory, wherein the digital signal processing unit includes a numerically-controlled oscillator (NCO), gain circuitry, and offset circuitry, wherein the gain circuitry is coupled to the output of the NCO, and the offset circuitry is coupled to the output of the gain circuitry;
wherein, in a first configuration, the digital signal processing unit is operable to obtain waveform data from the memory and perform digital up-conversion functions on the obtained waveform data;
wherein, in a second configuration, the digital signal processing unit is operable to obtain waveform data from the memory and perform data interpolation functions on the obtained waveform data; and
wherein, in a third configuration, the digital signal processing unit is operable to obtain data comprising attributes of a waveform from the memory and, using the NCO, perform hardware-controlled arbitrary waveform generation functions to generate waveform data having the corresponding attributes, wherein the data obtained from the memory includes phase, frequency, gain, and offset data;
wherein, in the third configuration, the NCO is configured to be programmed by the phase and frequency data obtained from the memory to generate waveform data having the programmed frequency and phase, wherein the gain circuitry is configured to be programmed by the gain data and the offset circuitry is configured to be programmed by the offset data, wherein the waveform data generated by the NCO having the programmed frequency and phase is provided to the gain circuitry to control the gain of the waveform data based on the programmed gain and independent of the offset, and then is provided to the offset circuitry to control the offset of the waveform data based on the programmed offset and independent of the gain.

18. A method for performing arbitrary waveform generation functions using an arbitrary waveform generator, wherein the arbitrary waveform generator includes a memory and a digital signal processing unit, the method comprising:
storing data for waveform generation in the memory; and
configuring the digital signal processing unit to perform one of a plurality of functions on data obtained from the memory;
wherein, in a first configuration, obtaining waveform data at the digital signal processing unit from the memory and performing digital up-conversion functions on the obtained waveform data;
wherein, in the first configuration, said obtaining waveform data includes obtaining base-band in-phase (I) data via a first data path and base-band quadrature-phase (Q) data via a second data path at the digital signal processing unit from the memory, wherein the first data path includes a first programmable gain circuit coupled to a first programmable offset circuit which is further coupled to first programmable interpolating filters, wherein the second data path includes a second programmable gain circuit coupled to a second programmable offset circuit which is further coupled to second programmable interpolating filters;

wherein, in the first configuration, controlling the gain independent of the offset using the first and second programmable gain circuits, and controlling the offset independent of the gain using the first and second programmable offset circuits;

wherein, in a second configuration, obtaining waveform data at the digital signal processing unit from the memory and performing data interpolation functions on the obtained waveform data; and wherein, in a third configuration, obtaining data comprising attributes of a waveform at the digital signal processing unit from the memory and performing hardware-controlled arbitrary waveform generation functions to generate waveform data.

19. The method of claim 18, wherein the digital signal processing unit includes additional processing components including a programmable numerically-controlled oscillator (NCO), wherein the method further comprising the digital signal processing unit interconnecting at least a subset of the plurality of processing components in different configurations to perform one of the plurality of functions using the data obtained from the memory.

20. The method of claim 19, wherein, in the first configuration, said performing digital up-conversion functions includes the digital signal processing unit interpolating base-band in-phase and quadrature-phase (IQ) data from a particular sample rate up to a higher sample rate via the programmable interpolation filters, and then translating the base-band IQ data to a programmable carrier frequency provided by the programmable NCO.

21. The method of claim 19, wherein, in the second configuration, said performing data interpolation functions includes the digital signal processing unit translating the obtained waveform data at a particular sample rate up to a higher sample rate.

22. A method for performing arbitrary waveform generation functions using an arbitrary waveform generator, wherein the arbitrary waveform generator includes a memory and a digital signal processing unit, the method comprising:

storing data for waveform generation in the memory; and
configuring the digital signal processing unit to perform one of a plurality of functions on data obtained from the memory;
wherein, in a first configuration, obtaining waveform data at the digital signal processing unit from the memory and performing digital up-conversion functions on the obtained waveform data;
wherein, in a second configuration, obtaining waveform data at the digital signal processing unit from the memory and performing data interpolation functions on the obtained waveform data; and
wherein, in a third configuration, obtaining data comprising attributes of a waveform at the digital signal processing unit from the memory and performing hardware-controlled arbitrary waveform generation functions to generate waveform data;
wherein, in the third configuration, the data obtained from the memory includes frequency data to program a numerically-controlled oscillator (NCO), phase data to program the NCO, gain data to program gain circuitry, and offset data to program offset circuitry of the digital signal processing unit, wherein said performing hardware-controlled arbitrary waveform generation functions includes, based on the programmed frequency, phase, gain, and offset, generating waveform data having the corresponding attributes using the digital signal processing unit;
wherein, in the third configuration, controlling the gain independent of the offset using the gain circuitry of the digital signal processing unit, and controlling the offset independent of the gain using the offset circuitry of the digital signal processing unit.

23. The method of claim 22, wherein the NCO includes an NCO memory, wherein the method further comprising the NCO memory receiving and storing customized waveform data from software, and the NCO performing arbitrary waveform generation functions based on the customized waveform data stored in the NCO memory.

24. The method of claim 22, wherein, in a fourth configuration, the method further comprising the digital signal processing unit performing software-controlled arbitrary waveform generation functions.

25. The method of claim 24, wherein, in the fourth configuration, the NCO includes an NCO memory, wherein said performing software-controlled arbitrary waveform generation functions includes the NCO memory receiving and storing customized waveform data from software, and the NCO performing arbitrary waveform generation functions based on the customized waveform data stored in the NCO memory.

26. An instrumentation system comprising:

a memory operable to store data for waveform generation; and
a digital signal processing unit configurable to perform one of a plurality of functions on data obtained from the memory;
wherein the digital signal processing unit includes a plurality of processing components including gain circuitry, offset circuitry, and interpolation filters;
wherein, in a first configuration, the digital signal processing unit is operable to obtain base-band in-phase and quadrature-phase (IQ) data from the memory and perform digital up-conversion functions on the obtained data;
wherein, in the first configuration, the digital signal processing unit is operable to control the gain of the base-band IQ data independent of the offset using the gain circuitry, and control the offset of the base-band IQ data independent of the gain using the offset circuitry, wherein, after the gain and offset operations, the digital signal processing unit is further operable to interpolate the base-band IQ data from a particular sample rate up to a higher sample rate using the interpolation filters;
wherein, in a second configuration, the digital signal processing unit is operable to obtain waveform data from the memory and perform data interpolation functions on the obtained waveform data; and
wherein, in a third configuration, the digital signal processing unit is operable to obtain data comprising attributes of a waveform from the memory and perform hardware-controlled arbitrary waveform generation functions to generate waveform data.

27. The instrumentation system of claim 26, wherein the digital signal processing unit further includes a numerically-controlled oscillator (NCO), wherein, after the interpolation operation, the digital signal processing unit is operable to translate the base-band IQ data to a programmable carrier frequency provided by the NCO.

* * * * *